United States Patent [19]
Anzai et al.

[11] Patent Number: 5,640,006
[45] Date of Patent: Jun. 17, 1997

[54] CONTROL CIRCUIT FOR A FAIL-SAFE MULTI-AXIS LIGHT BEAM TYPE SENSOR

[75] Inventors: Hiroji Anzai; Takashi Sugiyama; Tetsuya Ishioroshi, all of Tochigi-ken; Masakazu Kato, Saitama-ken, all of Japan

[73] Assignee: The Nippon Signal Co., Ltd., Tokyo, Japan

[21] Appl. No.: 454,378

[22] PCT Filed: Oct. 12, 1993

[86] PCT No.: PCT/JP93/01463

§ 371 Date: Jun. 7, 1995

§ 102(e) Date: Jun. 7, 1995

[87] PCT Pub. No.: WO95/10789

PCT Pub. Date: Apr. 20, 1994

[51] Int. Cl.[6] ............................................. G01V 8/00
[52] U.S. Cl. ................... 250/221; 250/214 B; 340/556
[58] Field of Search ........................ 250/221, 222.1, 250/214 B, 222.2; 340/555–557

[56] References Cited

U.S. PATENT DOCUMENTS

| | | | |
|---|---|---|---|
| 4,015,122 | 3/1977 | Rubinstein | 250/221 |
| 4,309,693 | 1/1982 | Craven | 341/134 |
| 4,661,880 | 4/1987 | Futsuhara | 361/93 |
| 4,757,417 | 7/1988 | Futsuhara | 361/86 |
| 5,218,196 | 6/1993 | Dogul et al. | 250/221 |

FOREIGN PATENT DOCUMENTS

| | | |
|---|---|---|
| 57-142578 | 9/1982 | Japan . |
| 61-198094 | 9/1986 | Japan . |
| 61-198089 | 9/1986 | Japan . |
| 3-30338 | 3/1991 | Japan . |
| 4-70589 | 3/1992 | Japan . |
| 5-30068 | 2/1993 | Japan . |
| WO94/23303 | 10/1994 | WIPO . |

Primary Examiner—Que Le

[57] ABSTRACT

A multi-axis light beam type sensor with a simple fail-safe sensor system which stops when the sensor system is abnormal (logic value "0") is provided. The construction is such that scanning output signals for synchronously driving respective light emitting elements (LD) and light receiving elements (PD) positioned facing each other are generated using shift registers. A normal or abnormal condition of the scanning output signals is judged based on an output of the light transmission side shift register (5), using an addition operation in a scanning output signal checking circuit (9). Moreover, coincidence or non coincidence of last stage outputs of the respective shift registers of the light transmission and light reception sides, is determined by a coincidence detecting circuit (10).

6 Claims, 11 Drawing Sheets

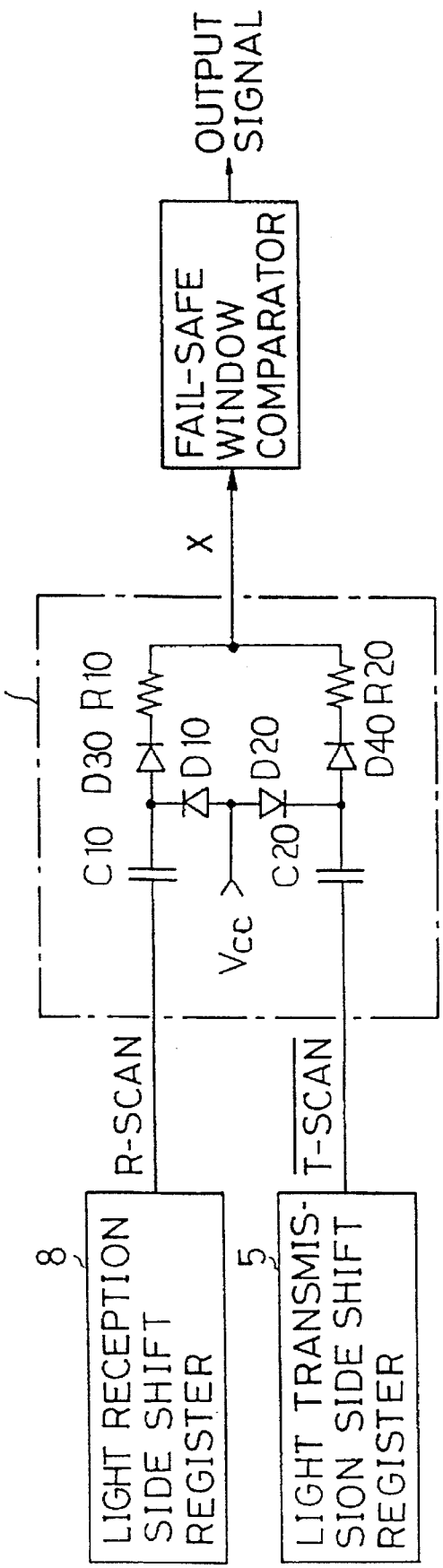

CONTROL CIRCUIT FOR A FAIL-SAFE MULTI-AXIS LIGHT BEAM TYPE SENSOR

TECHNICAL FIELD

The present invention relates to a high safety fail-safe multi-axis light beam type sensor, wherein multiple light emitting elements and light receiving elements arranged so as to face each other across a danger region to be monitored, are sequentially synchronized to be scan driven. When light beams from the light emitting elements are received by the light receiving elements, an output of logic value "1" is generated indicating a safe situation with nothing present in the danger region, while when the light beams are not received, an output of logic value "0" is generated indicating a dangerous situation with something present in the danger region.

BACKGROUND ART

Multi-axis light beam type sensors such as disclosed in U.S. Pat. No. 4,309,693 have been adopted as one method of ensuring the safety of an operator in situations such as where the operation of an industrial machine such as a press is carried out manually by the operator.

With such multi-axis light beam type sensors, a danger region wherein it is dangerous for the operator to be present when the machine is operating, and a safe region wherein it is safe to be present are prescribed. At the boundary between these regions, a plurality of light emitting elements and light receiving elements are arranged facing each other so that light beams from the light emitting elements are emitted towards the light receiving elements. When a portion of an operator's body blocks at least one of the light beams so that a light received output is not generated from the light receiving element, it is judged that an operator has entered the danger region, and the machine is stopped to thus ensure the safety of the operator.

In order to construct a fail-safe light beam type sensor however, there are three important signal treatments essential to the construction, as discussed below:

(1) The input signal to the light receiver R is made an alternating current signal.

As shown by oscillations between B1 and B0 in FIG. 1, the output signal from a light transmitter T (light beam B) is transmitted to a light receiver R, as an alternating signal wherein a light present condition (B1) and a light absent condition (B0) are output alternately. With this method, as seen from the light receiver R side, a level of B1 (light present) implies that the light beam is not being cut off by an object (i.e. a safe condition), while a level of B0 (light absent) implies that the light beam is being cut off by an object (i.e. an unsafe condition). A light receiving element and an amplifier which constitute the light receiver R take this alternating signal and amplify it. Thus when an object is actually in a region X (the region to be confirmed safe), the alternating signal is not received, while when the object is absent, the alternating signal is received. In other words with this method, even when there is no object present (i.e. a safe condition), the received signal indicating this also includes the signal (B0) indicating danger.

(2) A signal y=1 indicating safety is made a rectified output signal of the alternating current signal.

The output signal of the AC amplifier in FIG. 1 is rectified by a voltage doubler rectifier circuit to give a direct current output signal y=1. In FIG. 1, only when the input signal level B0 (indicating danger) is received by a capacitor CA, a charge of the polarity shown in FIG. 1 builds up through a diode DA. Then the input signal level B1 (indicating safety) is superimposed on this charging voltage and is stored in the capacitor CB through a diode DB as a direct current output voltage $V_{DC}$. This stored voltage $V_{DC}$ is not produced as long as the capacitor CA is not being charged by the input signal level B0. That is, the direct current output voltage $V_{DC}$ indicating safety is only produced when the input signal level B0 indicating danger is received.

The signal receiving method illustrated by FIG. 1, thus becomes one which can verify, at the time of generation of the signal indicating safety ($V_{DC}$), that the light receiving element and the AC amplifier are able to indicate danger. If this operation is expressed logically, then an output signal y=1 is produced by the logical product of; the region X is safe: and the light receiver R is able to indicate danger. If the input signal level B1 is not received, the direct current output voltage $V_{DC}$ is not produced, thus indicating danger. Therefore in FIG. 1, the alternating light beam B sent from the light transmitter T checks whether or not there is an object in the danger region X, and at the same time acts as a test signal for checking whether or not the light receiving element and the amplifier of the light receiver R are operating normally.

(3) The output signal is output at a level higher than the power source potential.

In FIG. 1, the voltage doubler rectifier circuit is clamped at the power source potential Vcc using the diode DA, and the signal "y" is output with the rectified output voltage $V_{DC}$ superimposed on the power source potential Vcc. The reason for generating an output signal in this way with the rectified output voltage $V_{DC}$ superimposed on the power source potential Vcc (referred to as an output signal of a potential beyond the power source limits) is that, even in an extreme case as shown by the dotted line in the FIG. 1 wherein a short circuit fault occurs in the capacitor CA so that the power source potential Vcc is output directly to the output side, then this can be distinguished at the output side, from the output potential $V_{DC}$. That is to say, if in FIG. 1 the output potential of the voltage doubler rectifier circuit is V, then the binary output signal "y" is determined as follows;

$$y = 1, \quad V > Vcc$$
$$= 0, \quad V \leq Vcc$$

Thus, when an output potential higher than the power source potential Vcc (V >Vcc) is output, this gives a signal y=1 indicating safety, while when an output potential equal to or lower than the power source potential Vcc (V≦Vcc) is output, this gives a signal y=0 indicating danger.

By giving the signal y two values in this way, then even in an extreme case wherein a short circuit fault occurs in the capacitor CA, and the power source potential Vcc is output to the output side, there is no erroneous generation of a signal y=1 indicating safety.

The above described conventional multi-axis light beam type sensor as disclosed in U.S. Pat. No. 4,309,696 however, does not incorporate the beforementioned (1)–(3) signal treatment principles, and is therefore not fail-safe.

Accordingly, one of the present inventors has previously proposed a fail-safe multi axis light beam type sensor which adopts the abovementioned fail-safe signal treatment principles, and wherein light emitting elements and light receiving elements respectively opposed to each other are periodically scan driven (refer to Japanese Patent Application No. 5-30068).

With this sensor, continuous scanning output signals from respective scanning circuits on a light transmission side and a light reception side are generated in synchronous with each other along a time axis, to sequentially scan drive light emitting elements and light receiving elements so that sequential light beams from the light emitting element side to the light receiving element side are produced to detect an object in a danger region. At this time the construction is such that, when the scanning output signal from the scanning circuit continues as a single signal on the time axis, then this is made a normal condition, while when two or more scanning output signals are simultaneously overlapped along the time axis, or when one or more scanning output signals is lacking within a single scanning period, then this is made an abnormal condition, and the sensor output stops. In detecting the abnormal condition of the scanning output signal, an error detecting method based on a fail-safe multiple-valued logic operation using addition is adopted.

More specifically, the voltage levels of the scanning output signals which are generated for scanning the light emitting elements and the light receiving elements are added in turn using a voltage doubler rectifier circuit. The added voltage level is then subjected to a threshold operation in a fail-safe window comparator. The conditions that the scanning output signal continues as a single signal along the time axis, and that all the scanning output signals are generated in a single scanning period are detected by setting respective addition value levels, such that when the respective addition values are within a predetermined range, a window comparator produces an output voltage (logic value "1") showing that the generating conditions for the scanning output signal are normal, while when outside the predetermined range, the output voltage becomes zero (logic value "0") indicating that the generating conditions of the scanning output signal are not normal.

However, with such scanning output signal error detection methods, in detecting generation of all the scanning output signals (N in total), then N additions are required so that the voltage change of a single scanning output signal with respect to the sum $\Sigma N$ of the addition values of the voltage levels of the scanning output signals becomes $1/N$. Consequently, when the number N of scanning output signals (the number of light axes) is increased, the setting for the threshold value becomes very fine, making judgement using the threshold operation difficult. Moreover when the number of scanning output signals is increased so that the number of additions is increased, then the added voltage value increases. Consequently it becomes necessary to increase the voltage endurance of the capacitors used in the addition operation, resulting in problems relating to the increase in dimensions of the capacitors that can be used.

Furthermore, with this fail-safe multi-axis light beam type sensor, respective separate scanning circuits are provided on the light transmission side and the light reception side. Moreover, this fail-safe multi-axis light beam type sensor adopts a construction wherein the synchronization of the scanning for the light transmission side and the light reception side is verified by checking that a scanning output signal of the last light emitting element is sent to the light reception side, and this corresponds with a scanning output signal of the last light receiving element on the light reception side, so that synchronization of the scanning on the light transmission and light reception sides is detected by a separate system. As a result, the circuit structure of the sensor is complicated.

It is an object of the present invention to improve the abovementioned multi-axis light beam type sensor so that, threshold operation on the addition value is simple regardless of an increase in the number of scanning output signals, and the circuit structure of the sensor is simplified.

DISCLOSURE OF THE INVENTION

Accordingly, the fail-safe multi-axis light beam type sensor of the present invention is provided with, a scanning signal generating circuit for generating a scanning signal which includes a constant interval clock signal, a light transmission side scanning circuit having a shift register for generating sequential outputs for each input of the clock signal from the scanning signal generating circuit, for generating a scanning output signal for sequentially switching and scan driving a plurality of light emitting elements, based on the outputs from the shift register, so that sequential AC light beams are emitted from the plurality of light emitting elements, a light reception side scanning circuit having a shift register for generating sequential outputs for each input of the clock signal which is the same as for the light transmission side scanning circuit, for generating a scanning output signal for sequentially switching and scan driving a number of light receiving elements of the same number as the plurality of light emitting elements and positioned opposite thereto, based on the output of the shift register, and for generating an AC light received output signal when a light receiving element receives a light beam from a light emitting element, a fail-safe amplifying/level checking circuit for amplifying an AC light received output signal when such a signal is generated from the light reception side scanning circuit, and then level checking, and rectifying the signal and generating an output of logic value "1", with the output becoming a logic value of zero when the circuit is faulty, a fail-safe scanning output signal checking circuit for adding a plurality of scanning output signal levels of the light transmission side scanning circuit, and generating when the logic level of the added value is "1" an output of logic value "1" for a normal condition wherein only one scanning output signal is continuously generated, and generating when the logic level of said added value is "2" or more or zero, an output of logic value "0" for at least one of the abnormal conditions of; a scanning output signal is overlapped along the time axis; and at least one scanning output signal is not generated in a single scanning period, with the output becoming a logic value of zero when the circuit is faulty, a fail-safe coincidence detecting circuit for performing an addition operation on the outputs of the last stages of the respective light transmission side and light reception side shift registers, and when the logic level of the addition value is "1", judging that the outputs of the last stages are synchronized and generating an output of logic value "1", and when the logic level of the addition value is "2" or "0", judging that the outputs of the last stages are not synchronized and generating an output of logic value "0", with the output becoming a logic value of zero when the circuit is faulty, a fail-safe AND circuit for performing a logical product operation on the respective outputs of; the amplifying/level checking circuit, the scanning output signal checking circuit, and the coincidence detecting circuit, and when all the outputs are of a logic value "1", generating an output of logic value "1", with the output becoming a logic value of zero when the circuit is faulty, and a fail-safe sample/hold circuit for holding the output from AND circuit when this is logic value "0", for at least one scanning period of the scanning output signal, with the output becoming a logic value of "0" when the circuit is faulty.

With such a construction, the circuit structure of the sensor can be simplified, and even though the number of light axes is increased, the threshold operation on the addition value can be made easily, and since the voltage endurance for the capacitor used in the adding circuit need not be large, then the requirement for a large capacitor can be avoided.

More specifically, the light transmission side scanning circuit may comprise; a shift register constituted by a plurality of D-K flip-flops corresponding to the number of light emitting elements, a monostable multivibrator for taking the scanning signals from the scanning signal generating circuit and extending these pulse width for a predetermined time, and outputting the extended signals to a data input terminal of a first stage flip-flop of said shift register, a plurality of first NOT circuits connected to non inversion output terminals of the respective flip-flops, a plurality of light emitting elements with the cathode sides thereof connected to output terminals of the respective NOT circuits, a carrier signal generating circuit for generating a carrier signal of a predetermined frequency, connected to the anode sides of the respective light emitting elements through respective resistors, a plurality of second NOT circuits with input sides thereof connected between the respective light emitting elements and resistors, and output sides thereof connected to data input terminals of respective next stage flip-flops, and wherein the clock signal from the scanning signal generating circuit is input to the clock input terminals of the respective D-K flip-flops, and output signals to the scanning output signal checking circuit are taken off from intermediate points between the respective second NOT circuits and the respective flip-flop data input terminals.

Moreover, the light reception side scanning circuit may comprise; a shift register constituted by a plurality of D-K flip-flops corresponding to the number of light receiving elements, a monostable multivibrator for taking the scanning signals from the scanning signal generating circuit and extending these pulse width for a predetermined time, and outputting the extended signals to a data input terminal of a first stage flip-flop of said shift register, a plurality of third NOT circuits connected to inversion output terminals of the respective flip-flops, a plurality of light receiving elements positioned to face the light emitting elements with a danger region therebetween, and a plurality of AC amplifying circuits for amplifying light beam received signals from the respective light receiving elements, and wherein the same clock signal as for the light transmission side scanning circuit is input to the clock input terminals of the respective D-K flip-flops, and the output sides of the third NOT circuits are connected to respective output lines from the AC amplifying circuits and then connected via the respective output lines to respective data input terminals of the next stage flip-flops.

Moreover, the scanning output signal checking circuit may incorporate; an adding circuit comprising a plurality of coupling capacitors connected respectively in series to a plurality of input terminals for the input of a plurality of scanning output signals sequentially input from the shift register of the light transmission side scanning circuit, a plurality of first diodes for clamping the output sides of the respective coupling capacitors at the power source potential, and a plurality of second diodes for rectifying/transmitting the outputs of the coupling capacitors clamped at the power source potential by the respective first diodes, to a single output terminal, and a fail-safe first window comparator which performs a threshold operation on the output level of the adding circuit, and generates an output of logic value "1" when the output level is logic value "1", being inside the threshold value range, and generates an output of logic value "0" when the output level is logic value "0" or "2" or more, being outside the threshold value range, with the output becoming a logic value of "0" when the circuit is faulty.

Moreover, the coincidence detecting circuit may incorporate; an adding circuit comprising a plurality of coupling capacitors connected respectively in series to respective input terminals for the respective input of; the output of the last stage flip-flop of the shift register of the light transmission side scanning circuit, and the output of the last stage flip-flop of the shift register of the light reception side scanning circuit, respective third diodes for clamping the output sides of the respective coupling capacitors at the power source potential, and respective fourth diodes for rectifying/transmitting the outputs of the respective coupling capacitors clamped at the power source potential by the respective third diodes, to a single output terminal, and a fail-safe second window comparator which performs a threshold operation on the output level of said adding circuit, and generates an output of logic value "1" when the output level is logic value "1", being inside the threshold value range, and generates an output of logic value "0" when the output level is logic value "0" or "2", being outside the threshold value range, with the output becoming a logic value of "0" when the circuit is faulty, and wherein the output of the last stage flip-flop of the shift register of the light transmission side scanning circuit, and the output of the last stage flip-flop of the shift register of the light reception side scanning circuit, are input in complementary relation to each other to the adding circuit.

Moreover, the sample/hold circuit may comprise a fail-safe on-delay circuit which gives an output of logic value "0" at the time of a fault.

BRIEF DESCRIPTION OF THE DRAWINGS

FIG. 5 (B) is a time chart for illustrating an operation of the scanning output signal checking circuit at the time of an abnormality, wherein the output of the scanning output signal is overlapped;

FIG. 7 (B) is a time chart for illustrating a process of signal transmissions in the shift register;

FIG. 9 (B) is a time chart for illustrating a process of signal transmissions in the shift register;

FIG. 9 (C) is a circuit diagram illustrating the principle of construction of wiring connections in the shift register;

FIG. 10 is a circuit diagram of a coincidence detecting circuit; and

BEST MODE FOR CARRYING OUT THE INVENTION

As follows is a detailed description of embodiments of a fail-safe multi-axis light beam type sensor according to the present invention with reference to the drawings.

Figure 2:
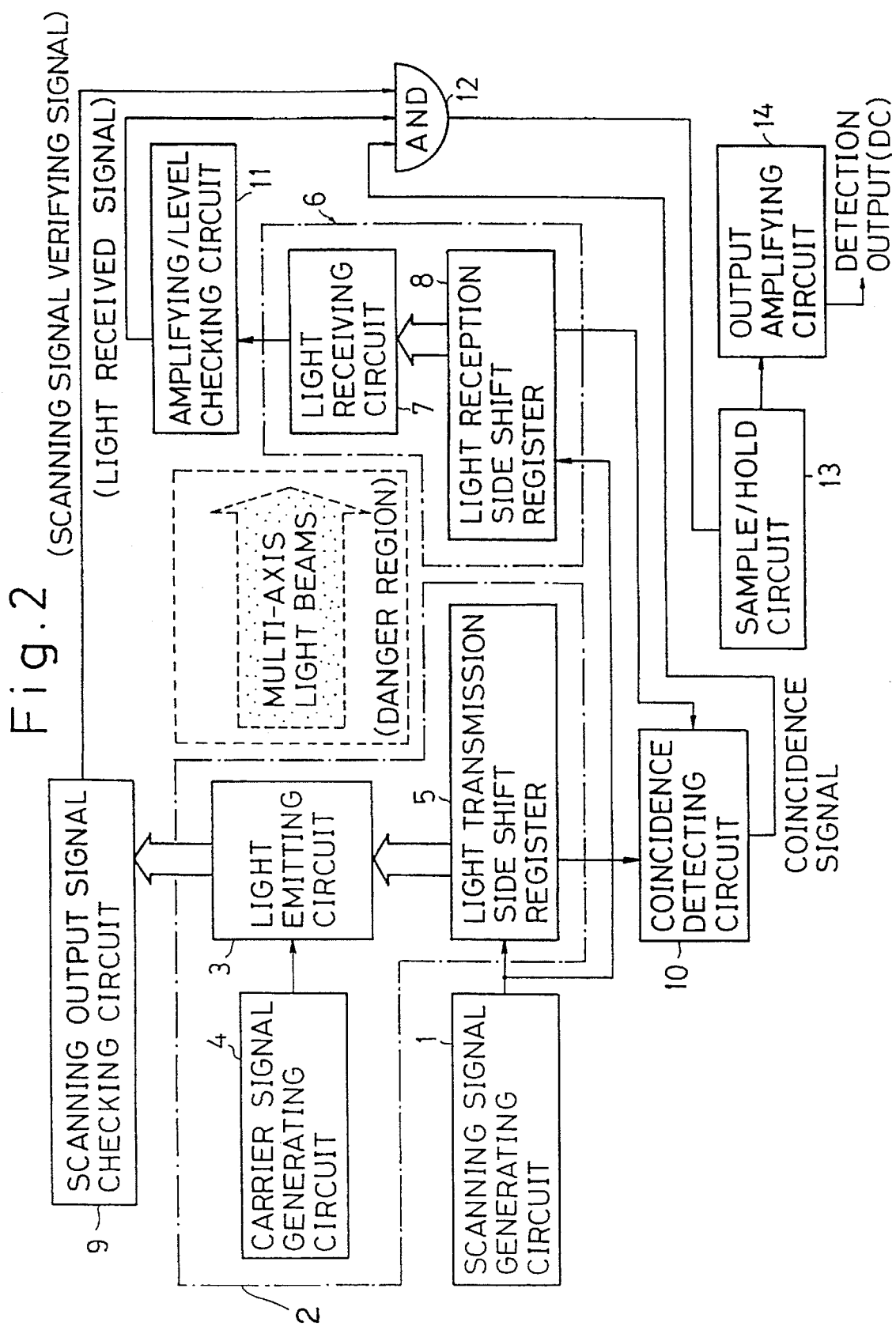
FIG. 2 is an overall structural diagram illustrating a first embodiment of a fail-safe multi-axis light beam type sensor according to the present invention.

FIG. 2 shows a schematic structural diagram of a fail-safe multi-axis light beam type sensor according to the present embodiment.

A scanning signal generating circuit 1 shown in FIG. 2 comprises; a clock signal generating circuit for generating a clock signal at constant intervals, a start signal generating circuit for generating a start signal for starting scanning, and an OR circuit for generating a logical sum output for the two signal generating circuits. The scanning signal generating circuit 1 generates a scanning signal (logical sum output of the start signal and clock signal) for sequentially driving respective shift registers of a light transmission side scanning circuit 2 and a light reception side scanning circuit 6 (described later).

The light transmission side scanning circuit 2 comprises; a light emitting circuit 3 for emitting sequential AC light beams at time divisions into a danger region, using a plurality of light emitting elements, a carrier signal generating circuit 4 for generating an AC carrier signal to change the plurality of light beams emitted from the light emitting circuit 3 into AC light beams, and a light transmission side shift register 5 for generating a scanning output signal to cause the plurality of light emitting elements of the light emitting circuit 3 to sequentially emit light along the time axis, based on a clock signal which is sequentially and serially input thereto at predetermined intervals from the scanning signal generating circuit 1.

The light reception side scanning circuit 6 has a plurality of elements which mutually oppose the respective light emitting elements of the light emitting circuit 3 with the danger region in-between. It comprises a light receiving circuit 7 which receives the respective AC light beams sequentially emitted from the light emitting circuit 3 in synchronous with the time divisions and converts the light received signals into series signals which are then output, and a light reception side shift register 8 which generates a scanning output signal based on the same clock signal as that input to the light transmission side shift register 3, so that the plurality of light receiving elements of the light receiving circuit 7 are able to sequentially received along the time axis.

A scanning output signal checking circuit 9 incorporates an adding circuit (described later) and a conventional known fail-safe window comparator such as disclosed in U.S. Pat. No. 4,661,880. It checks if the scanning output signal of the light transmission side scanning circuit 2 is normal or abnormal by means of a fail-safe adding operation and a threshold operation. At the time of normal conditions wherein the scanning output signal of the light transmission side scanning circuit 2 is continuously generated as a single signal along the time axis, the logic level of the addition value becomes "1" which is within the threshold value range of the window comparator so that an output (of logic value "1") is generated from the window comparator. At the time of an abnormality wherein overlapping of the scanning output signal occurs along the time axis, or a scanning output signal is lacking within one scanning period of the light emitting circuit 3, then the addition value becomes a logic level corresponding to a logic value of "2" or "0", which is outside the threshold value range of the window comparator, so that the output of the window comparator becomes zero (logic value "0").

A coincidence detecting circuit 10, verifies that the light transmission side and the light reception side are synchronized. To achieve this, the shift register outputs for the last stage of the light transmission side shift register 5 and the light reception side shift register 8, are input in complementary relation to each other, and both outputs subjected to an addition operation and a threshold value operation in the window comparator in a similar manner to the scanning output signal checking circuit 9. When both outputs are synchronized, the logic level of the addition value becomes "1" which is within the threshold value range of the window comparator so that an output (of logic value "1") is generated from the window comparator. When both outputs are not synchronized, then the addition value produces a logic level corresponding to a logic value of "2" or "0", which is outside the threshold value range of the window comparator, so that the output of the window comparator becomes zero (logic value "0").

Figure 1:
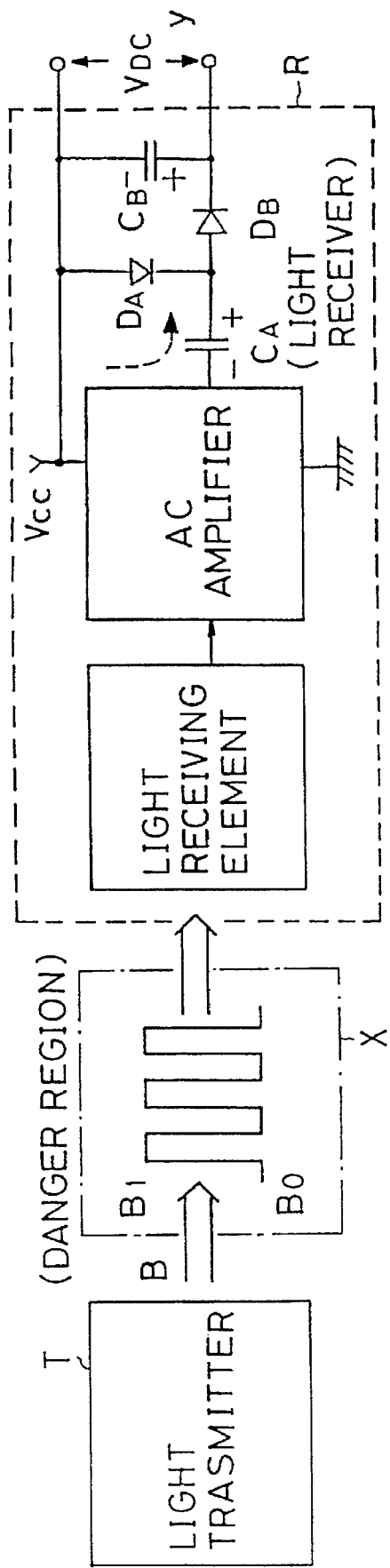
FIG. 1 is a circuit diagram illustrating the structural principles of a fail-safe light beam type sensor.

An amplifying/level checking circuit 11 has a similar construction to that of FIG. 1, in that it amplifies the light received signal output from the light receiving circuit 7, checks the level and rectifies the signal to produce a DC output signal. If the danger region is safe (no object present) it generates an output level of logic value "1", while if even one of the light receiving elements does not receive light from the light transmission side, or when a circuit fault occurs, the output level becomes zero (logic value "0") indicating danger.

An AND gate 12 acting as a logical product operation circuit, is a conventionally known fail-safe AND gate such as disclosed in U.S. Pat. No. 4,757,417, which generates an output of logic value "1" when all of the outputs of; the amplifying/level checking circuit 11,the coincidence detecting circuit 10 and the scanning output signal checking circuit 9 are a logic value "1", and generates an output of logic value "0" if even one has an output of logic value "0".

A sample/hold circuit 13 is constructed so that when the output of the AND gate 12 is a logic value "0", it holds this output for at least the time span of one scanning period. Moreover, it has a fail-safe construction in that the output becomes a logic value "0" at the time of a circuit fault. The sample/hold circuit 13 may be made up from a fail-safe on-delay circuit (refer to PCT/JP/93/00411).

An output amplifying circuit 14 amplifies the AC output signal from the sample/hold circuit 13 and then rectifies this to produce a DC detection output. If the sensor is operating normally and the light beams are not cut off by an object, an output of logic value "1" indicating safety is generated, while when the sensor is faulty, or at least one of light beams is cut off, an output of logic value "0" indicating danger is generated.

A description of the operation of the light beam type sensor of FIG. 2 will now be given with reference to the time chart of FIG. 3, which is for an example wherein there are eight light beam axes (eight respective light emitting elements and light receiving elements)

Figure 3:
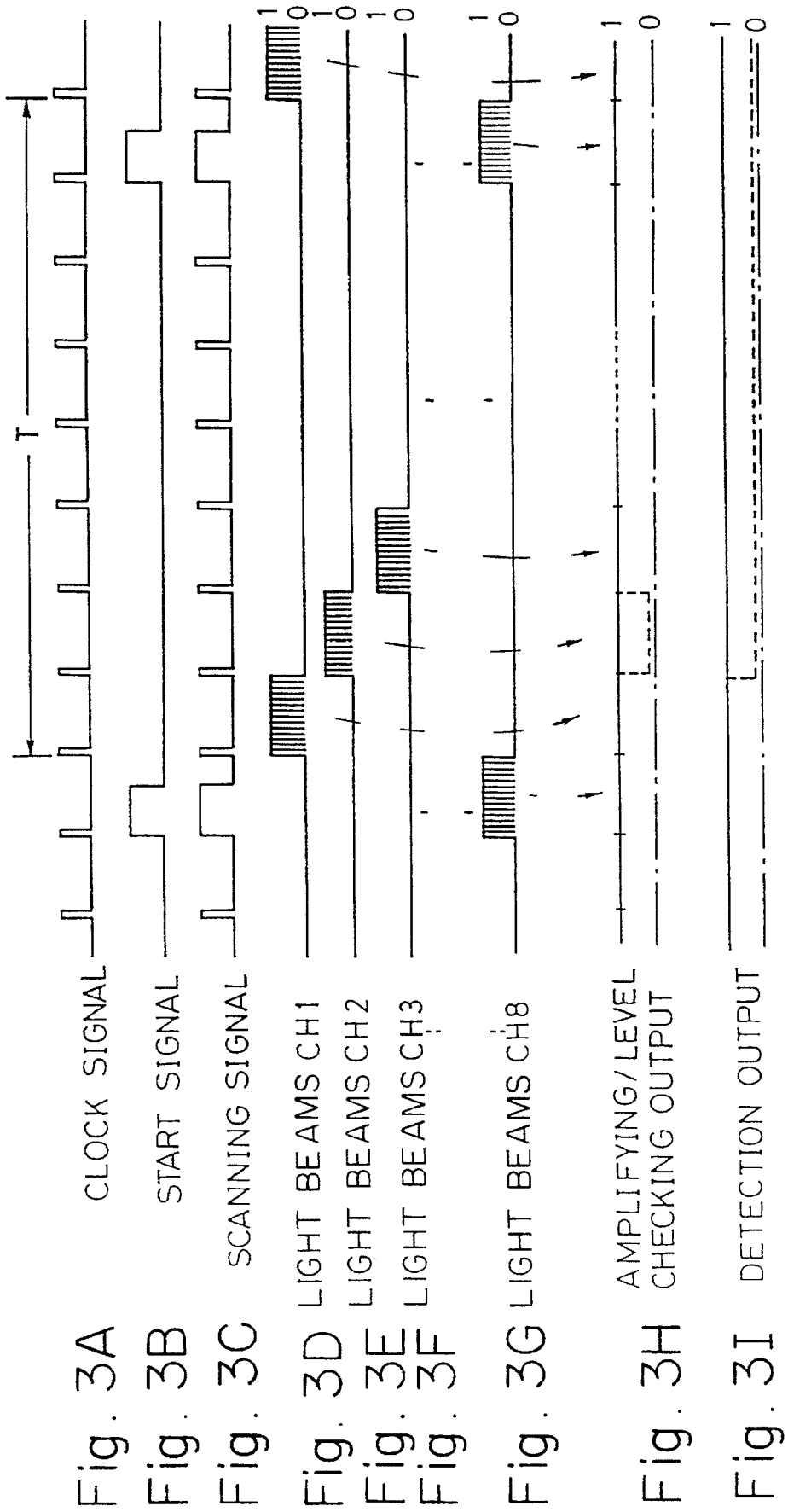
FIG. 3 is a time chart for illustrating an operation of the first embodiment.

As shown in FIG. 3, a series of clock signals from the clock signal generating circuit of the scanning signal generating circuit 1 are produced at constant intervals along the time axis, while start signals are generated from the start signal generating circuit at the rate of one signal per eight clock signals. Moreover, a scanning signal wherein a clock signal and a start signal are combined by means of an OR circuit, is input from the scanning signal generating circuit 1 to the light transmission side shift register 5 of the light transmission side scanning circuit 2, and to the light reception side shift register 8 of the light reception side scanning circuit 6. When this scanning signal is input, then at the light transmission side shift register 5, the signal generated by extending the pulse width of the falling component of the start signal, in the scanning signal is made the shift register data input signal, and operation is started by the clock signal at the time of generation of this data input signal. Scanning output signals are then sequentially generated in synchronous with the input of subsequent clock signals, with eight light emitting elements sequentially emitting light in a single scanning period T, with the operation being carried out repeatedly. With the light emitting elements, the AC carrier signals from the carrier signal generating circuit 4 which are synchronized with the generation of the scanning output signals are used, so that the light emitting elements emit AC light beams as shown by CH1, CH2, . . . CH8 of FIG. 3 towards the danger region. With the light reception side scanning circuit 6, operation of the light reception side shift register 8 which is synchronized with that of the light transmission side shift register 5, is started with input of the scanning signal from the scanning signal generating circuit 1, and the respective light receiving elements corresponding to the respective light emitting elements are sequentially driven. When the respective light beams are sequentially received by the light emitting elements with no object present in the danger region, the AC light received output from the light receiving circuit 7 is generated in series along the time axis. This output is amplified/level checked by means of the amplifying/level checking circuit 11 and then rectified, to give a series output of logic value "1" as shown in FIG. 3, which is then input to the AND gate 12.

At this time, the scanning output signal occurring in the light transmission side scanning circuit 2 is normal so that a single signal is continuously generated along the time axis as shown in FIG. 3. Moreover if the outputs of the final stages of the light transmission side shift register 5 and the light reception side shift register 8 are synchronized, then the output of the scanning output signal checking circuit 9 and that of the coincidence detecting circuit 10 both become a logic value "1" so that the output of the AND gate 12 becomes a logic value "1". A detection output of a logic value of "1" indicating a safe condition is thus generated from the output amplifying circuit 14 via the sample/hold circuit 13, indicating a safe condition with no object in the danger region.

On the other hand, in the case wherein at least one light beam, for example CH2, is cut off so that a light signal is not received by a light receiving element, then as shown by the dotted line in FIG. 3, the period corresponding to CH2 of the amplifying/level checking output becomes a logic value "0", so that the output of the AND gate 12 also becomes a logic value "0". When this AND gate output of logic value zero is input to the sample/hold circuit 13, the output of the sample/hold circuit 13 also becomes a logic value "0", and this output of logic value "0" is held for at least one scanning period T of the light beams CHi (i=1~8). Accordingly, if the light beam CH2 is not received periodically, then the output of the sample/hold circuit 13 is held at a logic value "0", so that the output of the output amplifying circuit 14 also becomes a logic value "0", as shown by the dotted line in FIG. 3, indicating a dangerous condition with an object present in the danger region.

Moreover, with abnormal conditions wherein the scanning output signal of the light transmission side scanning circuit 2 becomes overlapped on the time axis, or is lacking, the scanning output signal checking circuit 9 detects such abnormal conditions so that the output thereof becomes logic value "0". Also in the case wherein there is a discrepancy in the synchronization of the output of the final stage of the light transmission side shift register 5 and the light reception side shift register 8, the output of the coincidence detecting circuit 10 becomes a logic value "0". In either case, the output of the AND gate 12 becomes a logic value "0", so that a detection output indicating danger is generated from the output amplifying circuit 14.

A description of specific circuit constructions of the light transmission side scanning circuit 2, the light reception side scanning circuit 6, the scanning output signal checking circuit 9, and the coincidence detecting circuit 10 will now be given.

Figure 4:
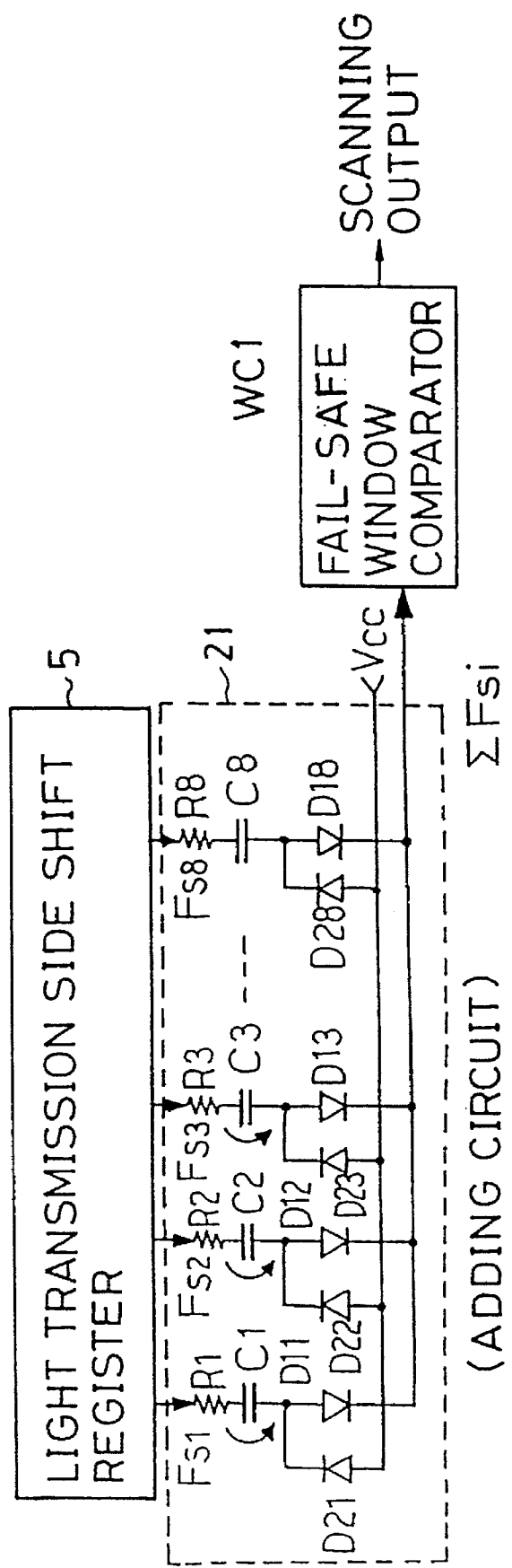
FIG. 4 is a circuit diagram of a scanning output signal checking circuit.

FIG. 4 shows a circuit structure of the scanning output signal checking circuit 9.

The scanning output signal checking circuit 9 comprises; an adding circuit 21 which incorporates a plurality of coupling capacitors C1~C8 respectively connected in series to a plurality of input side resistors R1~R8 through which a plurality of scanning output signals Fs1~Fs8 (to be described later) are successively input from the light transmission side shift register 5 of the light transmission side scanning circuit 2; a plurality of diodes D21~D28 acting as first diodes for clamping the respective output sides of the coupling capacitors C1~C8 at the power source potential Vcc; and a plurality of diodes D11~D18 acting as second diodes for rectifying/transmitting the outputs of the coupling capacitors C1~C8 clamped at the power source potential Vcc by the diodes D21~D28, to a single output terminal; and a fail-safe window comparator WC1 for threshold operation on the output level of the adding circuit 21.

Scanning output signal Fs1, Fs2 . . . Fs8 of the light transmission side shift register 5 are clamped at the power source potential Vcc by way of the respective capacitors C1~C8 and resistors R1~R8 using the respective diodes D21~D28, and output from the diodes D11~D18 to the window comparator WC1.

The operation will now be described with reference to the time charts of FIGS. 5(A) and(B).

Figure 5A:
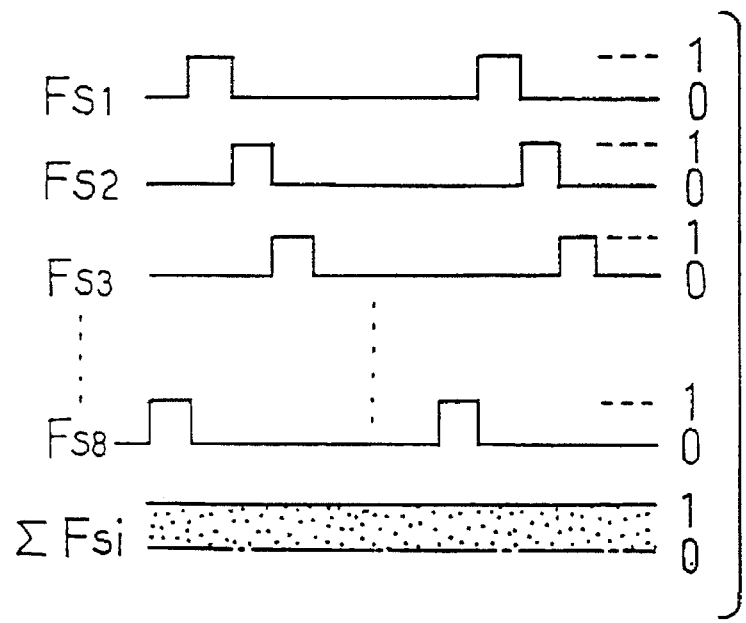
FIG. 5 (A) is a time chart for illustrating an operation of the scanning output signal checking circuit when the output of the scanning output signal is normal.

The time chart of FIG. 5(A) shows the case where the scanning output signal of the light transmission side shift register 5 is normal. The time chart of FIG. 5(B) shows the abnormal case wherein the scanning output signal Fs8 of the light transmission side shift register 5 is not produced at the time that it should be output, and is erroneously produced at the generation time of the scanning output signal Fs1.

As shown in FIG. 5(A), when the scanning output signals Fsi (i=1~8) are normally generated so that a single signal is continuously generated along the time axis, then the addition signal $\Sigma Fsi$ of the adding circuit 21 is always at a logic level of logic value "1" (the output wherein the scanning output signals Fsi are superimposed on the power source potential Vcc of the window comparator).

Figure 5B:
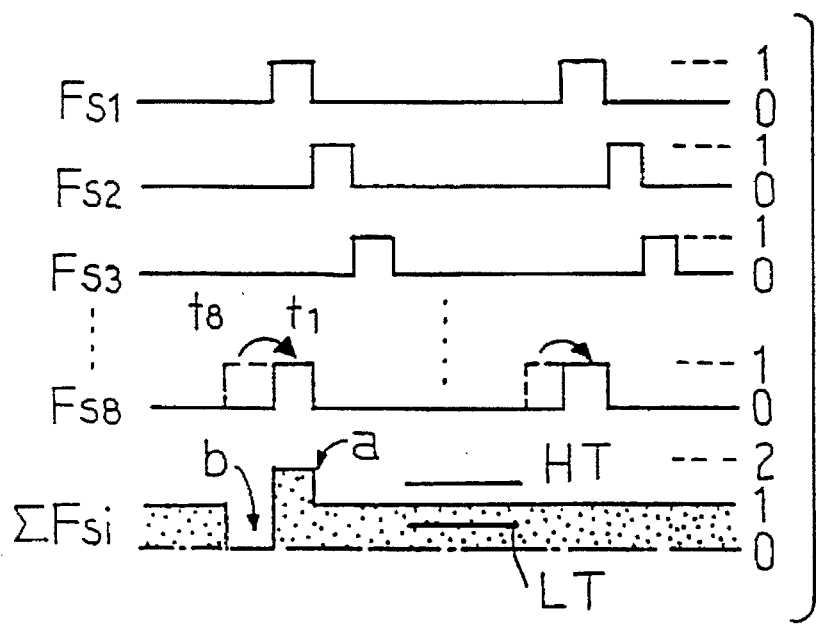

On the other hand, in the case of FIG. 5(B), the addition signal $\Sigma Fsi$ produces a logic level "b" of logic value "0" (the power source potential Vcc) since the scanning output signal Fs8 does not exist at a time t8 where the scanning output signal Fs8 should have been generated, and a logic level "a" of logic value "2" is produced since the scanning output signal Fs8 is superimposed on the scanning output signal Fs1 at a time t1 where the scanning output signal Fs1 only should be generated.

The upper and lower limit threshold values of the window comparator WC1 as shown by HT and LT in FIG. 5(B) are set on either side of the logic level of logic value "1", being lower than logic value "2" and higher than logic value "0". Therefore, in the case of FIG. 5(A), a scanning output of logic value "1" indicating normal operation is generated from the window comparator WC1, while in the case of FIG. 5(B), since the addition signal $\Sigma Fsi$ has logic levels of logic value "0" and "2", a scanning output of logic value "0" showing an abnormal condition is generated from the window comparator WC1.

The circuit construction of the scanning output signal checking circuit 9 has the following features.

The adding circuit 21 constituted by capacitors C1~C8, diodes D11~D18, and diodes D21~D28 has capacitor coupling. Moreover, since it is clamped at the power source potential Vcc using the diodes D21~D28 (coupling by a potential beyond the power source potential), then a signal is transmitted only when positive signal changes occur in the scanning output signals Fs1~Fs8. Consequently, when a fixed fault which fixes a scanning output signal Fsi at "1" or "0", occurs in the light transmission side shift register 5, then an output of logic value "1" is not produced in the adding circuit 21 (only when an output of the light transmission side shift register 5 changes, an output of logic value "1" with a scanning output signal Fsi superimposed on the power source potential Vcc is generated). As a result, when a fixed fault occurs in the light transmission side shift register 5, the output of the window comparator WC1 becomes a logic value "0".

The scanning output signal checking circuit 9 has another important fault checking function. Since the shift register is constituted by C-MOS IC, then when for example a disconnection fault occurs in the data input line to the light transmission side shift register 5, an erroneous output is produced, due for example to noise, in the flip-flop circuits of the shift register. In the case with the time chart of FIG. 5(A) wherein the output signals Fs1~Fs8 of the shift register are output normally, the addition signal ΣFsi is always at a logic level of "1". However when, as shown by the time chart of FIG. 5(B), as well as (or instead of) being generated at a time t8, a scanning output signal Fs8 is also generated at a time t1 for generation of a scanning output signal Fs1 (normally the above error occurs at several different times), then at the time t1, the addition signal ΣFsi becomes a logic level for two added scanning output signals. Since the window comparator WC1 has upper and lower threshold values HT and LT which are lower than logic level "2" and higher than logic level "0", with an output signal of logic level "1" being produced when the input signal is within the threshold value range, then when a logic level of "2" or "0" is produced in the addition signal ΣFsi, the output of the window comparator WC1 becomes zero (logic value "0"). Moreover, when a disconnection fault occurs in a capacitor Ci (i=1~8), the addition signal ΣFsi becomes a logic level "0", so that the output of the window comparator WC1 becomes logic value "0".

There is however a case where an output signal of logic value "1" occurs when, due to a fault of the light transmission side shift register 5, an overlap occurs in a scanning output signal Fsi, and a fault also occurs in the adding circuit 21 to which the overlap signal should be transmitted, that is to say, when a double fault occurs wherein the light transmission side shift register 5, and the adding circuit 21 fault at the same time. For example, when a fault occurs in the circuit for transmitting the signal Fs1, or the circuit for transmitting the signal Fs8, at the time t1 of the time chart of FIG. 5(B), (for example a disconnection fault in the capacitor C1 or the capacitor C8), then the addition signal ΣFsi will become a logic level of "1". While this is a defect of the circuit of FIG. 5, it can be compensated for due to the circuit structure of the light transmission side scanning circuit 2 to be described later. When a fault arises in the adding circuit 21 with the light transmission side shift register 5 operating normally, the logic level of the addition signal ΣFsi becomes 0.

The circuit structure of the light transmission side scanning circuit 2 shown in FIG. 6 will now be described.

Figure 6:
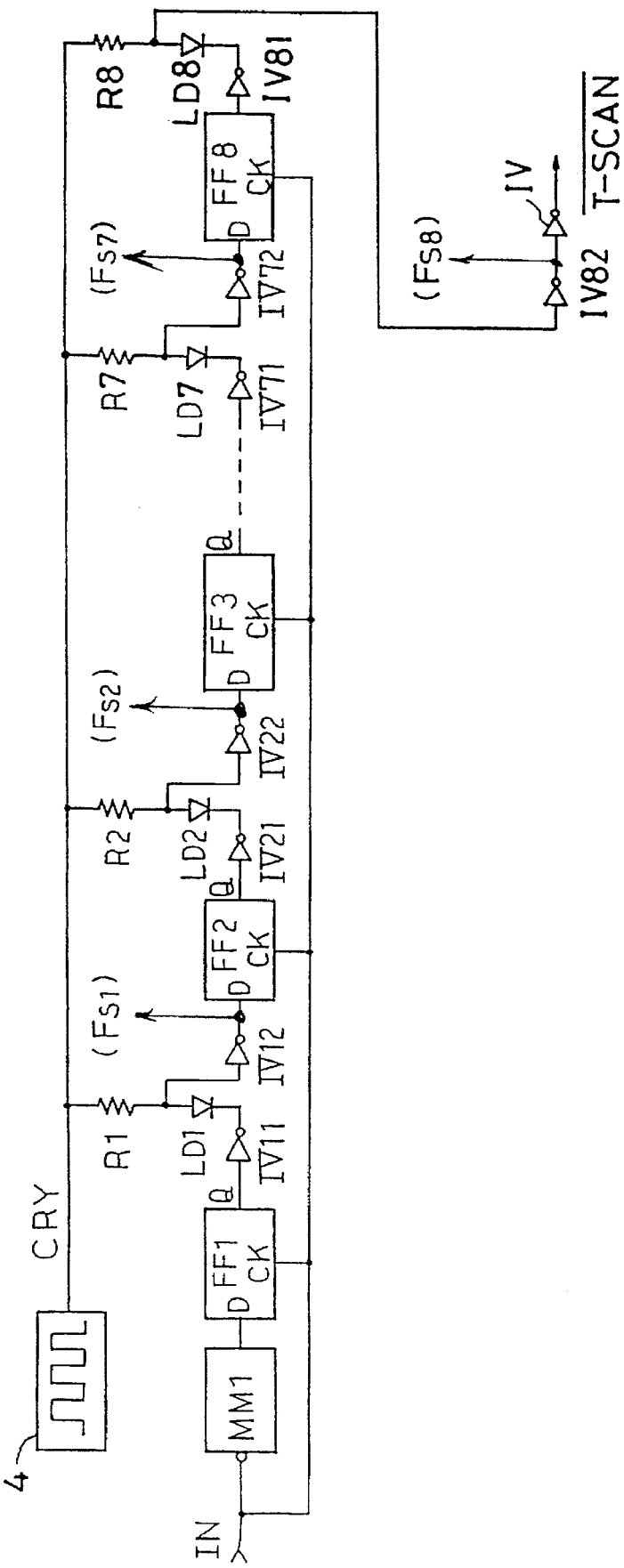
FIG. 6 is a circuit diagram of a light transmission side scanning circuit.

In FIG. 6, D-K flip-flops FF1~FF8 constitute a shift register. A monostable multivibrator MM1 takes the scanning signals from the scanning signal generating circuit 1, extends these pulse width for a predetermined time, and outputs the extended signals to a data input terminal of a first stage flip-flop FF1 of the shift register. NOT circuits IV11~IV81 (first NOT circuits) are respectively connected to non inversion output terminals of the D-K flip-flops FF1~FF8, with output sides thereof respectively connected to the cathode sides of light emitting elements LD1~LD8. The anode sides of the light emitting elements LD1~LD8 are respectively connected by way of current-limiting resistors R1~R8, to the carrier signal generating circuit 4 which generates a carrier signal CRY of a predetermined frequency. Moreover, input sides of NOT circuits IV12~IV82 (second NOT circuits) are respectively connected to intermediate points between the respective light emitting elements LD1~LD8 and the current-limiting resistors R1~R8. The output sides of the NOT circuits IV12~IV72 are respectively connected to data input terminals of the next stage flip-flops. Moreover, the scanning output signals Fsi (i=1~8) for output to the scanning output signal checking circuit 9 are taken off from the output sides of the respective NOT circuits IV12~IV82. IN is the scanning signal output from the scanning signal generating circuit 1. NOT circuit IV inverts the output of the last stage flip-flop FF8 for input to the coincidence detecting circuit 10.

Figure 7A:
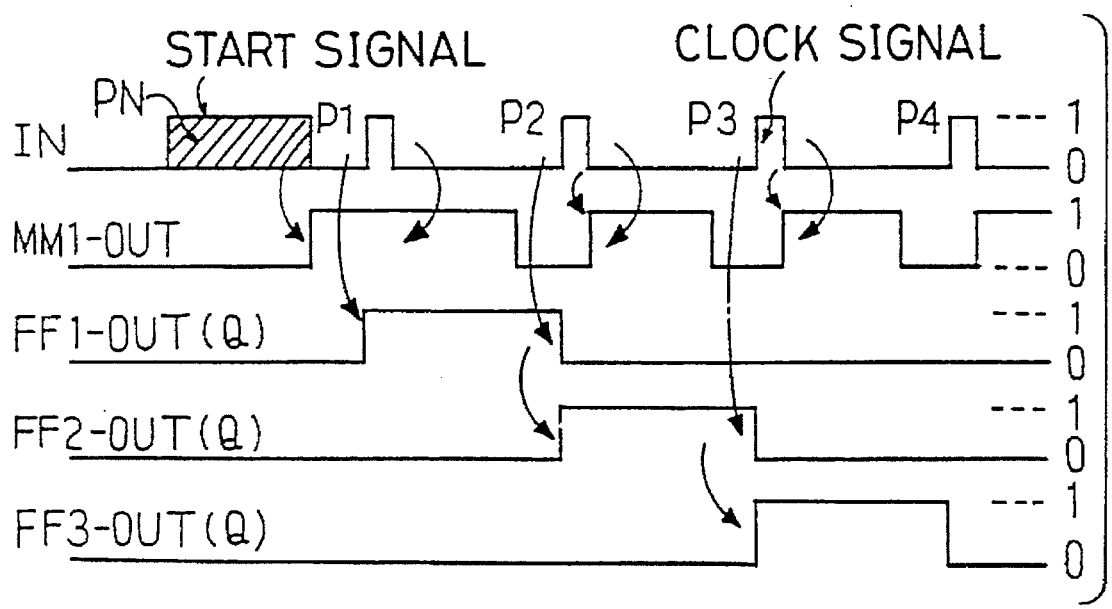
FIG. 7 (A) is a time chart for illustrating an operation of a shift register of the light transmission side scanning circuit.

With the shift register constituted by the flip-flops FF1~FF8, the signal resulting from pulse width extension of the scanning signal IN using the monostable multi-vibrator MM1 is used as the data side input signal for the first flip-flop FF1. As a result, as shown by the time chart of FIG. 7(A), after detecting a start signal PN included in the scanning signal IN and operating the first flip-flop FF1 in synchronous with the input of the first clock signal, the scanning output signals Fsi (i =2~8) are generated sequentially in synchronous with the generation of the clock signals, by the flip-flops FF2~FF8.

Figure 7B:
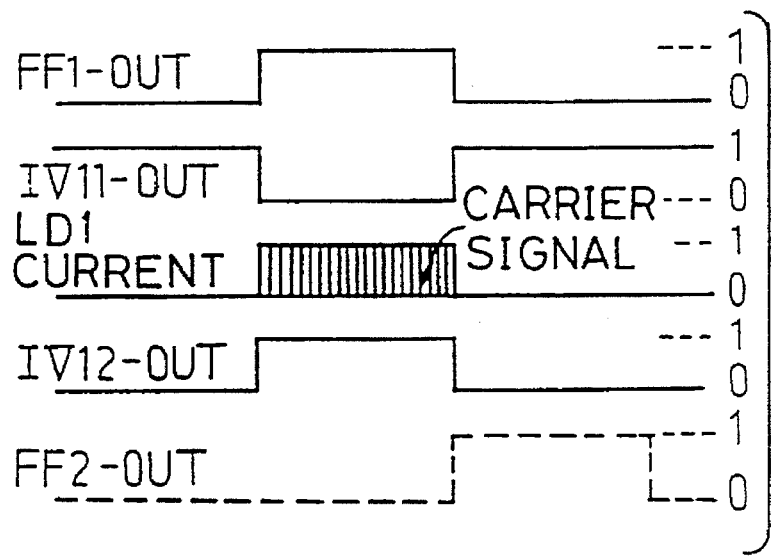

FIG. 7(B) is a time chart showing the operation of the coupling circuits between the flip-flops. In this figure, the operation between flip-flops FF1 and FF2 is explained.

When an H level output is generated from the flip-flop FF1, the NOT circuit IV11 output becomes an L level, and the carrier signal CRY flows in the light emitting element LD1 so that an AC light beam is emitted. As a result of the light emission (a result of light emitting elements LD1 coming ON) the input side of NOT circuit IV12 becomes L level and the output side becomes H level so that a signal of H level is input to the data input side of the next stage flip-flop FF2. When in this condition the next clock signal is input to the flip-flop FF2, the output of the flip-flop FF2 becomes H level. In this way, a construction is adopted wherein the scanning output signal Fs1 for input to the adding circuit 21 is generated as an input signal for the flip-flop FF2.

Here, the basic consideration concerning fault detection for the light transmission side scanning circuit of FIG. 6 which uses a shift register is based on the facts described below. The first is that when a fixed fault of logic value "0" (L level) occurs in the input signal to a flip-flop, then a logic value "1" (H level) does not occur in the output signal of the last stage flip-flop FF8. The second is that, when a fixed fault of logic value "1" occurs in the input signal to a flip-flop, (this situation includes the case wherein the light emitting element continuously emits light) the subsequent stage flip-flops all fixed at a logic value "1"

In the first case, when an output signal from the last stage flip-flop FF8 is not produced, then at the same time, an input signal to the adding circuit 21 is also not produced. In the second case, generally, an output signal of the last stage flip-flop FF8 is fixed. However, if the flip-flops are reset for any reason, then a plurality of flip-flops are operated simultaneously, and this simultaneous operation is propagated to the subsequent stage flip-flop. As a result, the overlapping of the signal shown on the time chart of FIG. 5(B) normally occurs at a plurality of locations, and is thus able to compensate for the defect in the scanning output signal checking circuit 9 of FIG. 4, wherein a logic value "1" is produced by double faults.

Furthermore, in the case where a fixed fault of the input signal to the subsequent stage flip-flop FF2 occurs as a result of a fault in the respective NOT circuits IV11, IV12 of the coupling circuits between the flip-flops FF1 and FF2, or due to a disconnection fault in the wiring, then as mentioned before, the output of the adding circuit 21 becomes a logic value "0" and the output of the scanning output signal checking circuit 9 becomes a logic value "0" thereby enabling warning of the abnormality. Moreover, also in the case wherein a short circuit or a disconnection fault occurs in the capacitor C1, then in a similar manner, a scanning output indicating an abnormality is produced. Furthermore, when the light emitting element LD1 is operating normally with the output of the NOT circuit IV11 at logic value "0", then a carrier signal CRY is never produced as an output of logic value "1" (H level) of the NOT circuit IV12. In the worst case, wherein the output of the NOT circuit IV11 faults to become a logic value "1", or a disconnection fault occurs in the light emitting element LD1, then the carrier signal CRY becomes the input to the NOT circuit IV12, and the output signal of the NOT circuit IV12 based on this input becomes the input signal to the flip-flop FF2 and the capacitor C1. However, at this time, since the light emitting element LD1 does not emit light, then the output of the sensor indicates danger.

The circuit structure of the light reception side scanning circuit 6 shown in FIG. 8 will now be described.

Figure 8:
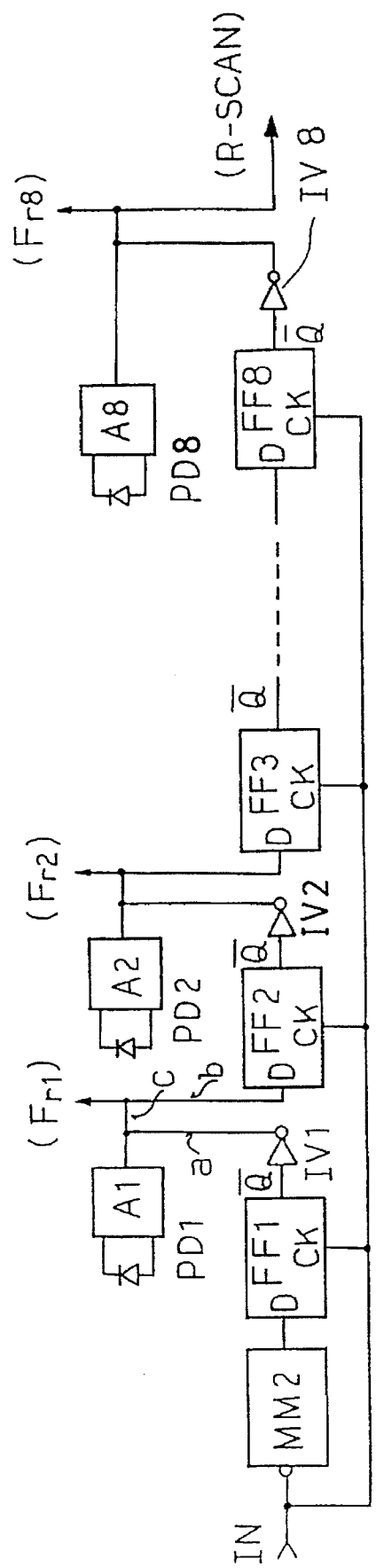
FIG. 8 is a circuit diagram of a light reception side scanning circuit.

The circuit in FIG. 8, with a monostable multivibrator MM2, and D-K flip-flops FF1~FF8 constituting a shift register, has a similar structure to that of the light transmission side scanning circuit 2 of FIG. 6. NOT circuits IV1~IV8 (third NOT circuits) are connected to the inversion output terminal sides of respective flip-flops FF1~FF8. Light receiving elements PD1~PD8 are positioned to face the light emitting elements LD1~LD8 with the danger region therebetween. The light beam received signals output from the light receiving elements PD1~PD8 are amplified by fail-safe AC amplifying circuits A1~A8 (refer to PCT-JP93/00411). The construction is such that the output lines "a" of the NOT circuits IV1~IV7 are connected to respective output lines "c" from the AC amplifying circuits A1~A8, and then connected via the respective output lines "c" to respective data input terminals of the next stage flip-flops. Symbols Fr1~Fr8 indicate the output signals from the respective AC amplifying circuits A1~A8 (light beam received signals from the light receiving elements PD1~PD8, which become the inputs to the next stage amplifying/level checking circuit 11.

Figure 9A:
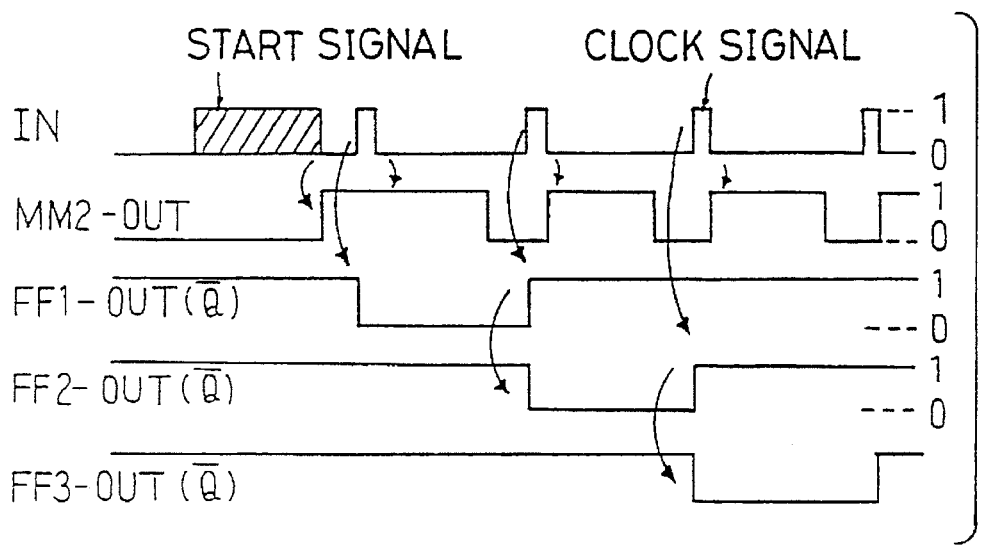
FIG. 9 (A) is a time chart for illustrating an operation of the shift register of the light reception side scanning circuit.

With the shift register which uses the flip-flops FF1~FF8, as with the light transmission side scanning circuit 2, the scanning signal IN is made a clock signal and the output signal of the monostable multivibrator MM2 based on the scanning input signal IN, is made the input signal for the data side of the first flip-flop FF1. As a result, as shown by the time chart of FIG. 9(A), after detecting a start signal included in the scanning signal IN to operate the first flip-flop FF1 in synchronous with the input of the first clock signal, output signals are generated by the flip-flops FF2~FF8, sequentially and in synchronous with the generation of the clock signals.

Figure 9B:
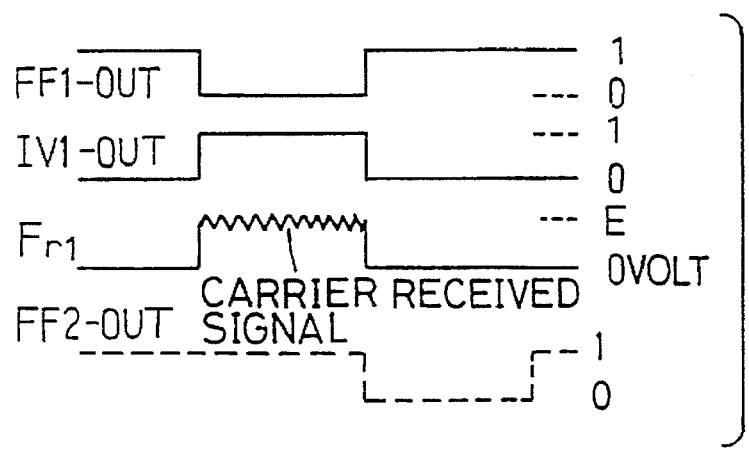
Figure 9C:
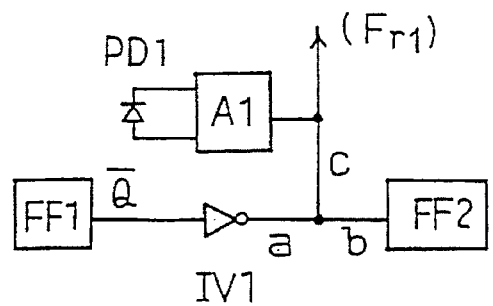

FIG. 9(B) shows the signal transmission process of the flip-flops FF1, FF2. When the output of the flip-flop FF1 is at low level L (logic value "0"), the output of the NOT circuit IV1 becomes a high level H (logic value "1"), and an AC output based on receipt of the light beam of the light receiving element PD1 is output as output signal Fr1. In FIG. 8, to ensure that control for the output signal Fr1 from the NOT circuit IV1 is surely transmitted to the output line of the AC amplifying circuit A1, the connections of the lines "a", "b", "c" are made as shown in the figure. This connection structure, with line "c" connected prior to line "b", ensures that if a disconnection occurs in line "a" or line "b", the shift register does not proceed. Even if the lines "a", "b" and "c" are connected as shown for example in FIG. 9(C), then the signal Fr1 from the output line of the AC amplifying circuit A1 can also be controlled in a similar manner using the output signal of the NOT circuit IV1. However, in FIG. 9(C), if the line "c" is disconnected, the shift register will still operate normally, in spite of the fact that the output signal of the NOT circuit IV1 will then have no influence on the output signal Fr1. The construction of FIG. 9(C) is therefore not fail-safe.

The circuit of FIG. 8, is constructed based on two forms of logic; the first being that, when a fault occurs in the AC amplifying circuits A1–A8, the light beam received output signals Fr1~Fr8 are never output; and the second being that, when a fault occurs in the elements making up the shift register including the control lines "a", "b", then the influence of the fault is always apparent in the last stage flip-flop.

A description of fault detection of the light reception side scanning circuit will now be given.

Provided that there are no errors in checking an output signal R-SCAN of the light reception side shift register 8, and an inversion output signal T-SCAN of the light transmission side shift register 5, (fail-safe check), the following faults (1), (2) are permissible in the circuit of FIG. 8.

(1) A fault wherein the output signals Fri of the AC amplifying circuits Ai (i=1~8) do not have an input of the signals from the NOT circuits IVi (i=1~8) (the output signals of AC amplifying circuits Ai, are all output on the time axis). [69]

(2) A plurality of outputs of logic value "1" are output simultaneously by the flip-flops FFi (i=1~8) constituting the shift register.

This is provided that, the connections of the NOT circuits IVi (i=1~7) to the flip-flops FFi-1 (i=2~8) involve the wiring structure shown in FIG. 8, wherein line "c" is connected prior to line "b".

With the above fault (1), even if for example a fault occurs in the NOT circuit IV1 giving an output of logic value "1" (H level), and the wiring "a" becomes disconnected so that the output signal Fr1 from the AC amplifying circuit A1 is output continuously, the period of the shift register output signal R-SCAN will change, and this fault can thus be detected. This is provided that the connection of the NOT circuit IV1 to the flip-flop FF2 involves the wiring structure shown by lines "a" and "b" (since line "a" is connected via the output terminal of the AC amplifying circuit A1 prior to line "b", then if line "a" or line "b" becomes disconnected, the output signal from the NOT circuit IV1 will not be transmitted to the flip-flop FF2).

With the above fault (2), when a fixed fault occurs in the output of; the multivibrator MM2, the flip-flops FFi (i=1~8), or the NOT circuits IVi (i=1~8), giving an output of logic value "1"(H level) or "0" (L level), the output of the shift register output signal R-SCAN will be either fixed at a logic value of "1" (H level) or "0" (L level), or change frequently between "1" and "0", or the frequency of the signal will be considerably lengthened. Therefore, since the output will not be generated at the normal period, the light transmission side shift register inversion output signal T-SCAN will not coincide with the light reception side shift register output signal R-SCAN.

The circuit structure of the coincidence detecting circuit 10 shown in FIG. 10 will now be described.

The output of the last stage flip-flop FF8 from the light transmission side shift register 5 is inverted by the NOT circuit IV and is output as inversion output signal T-SCAN. The inverted output of the last stage flip-flop FF8 from the light reception side shift register 8 is inverted by the NOT circuit IV8 and is output as output signal R-SCAN of complementary relation to the inversion output signal T-SCAN of the light transmission side shift register 5. Both the inversion output signal T-SCAN and the output signal R-SCAN, are added using the adding circuit 22, similar to that of FIG. 4, comprising capacitors C10, C20, diodes D10~D40 and resistors R10, R20 (the resistors R10, R20 may be connected before the capacitors C10, C20). The addition output is then subjected to threshold operation in a fail-safe window comparator WC2.

Figure 11:
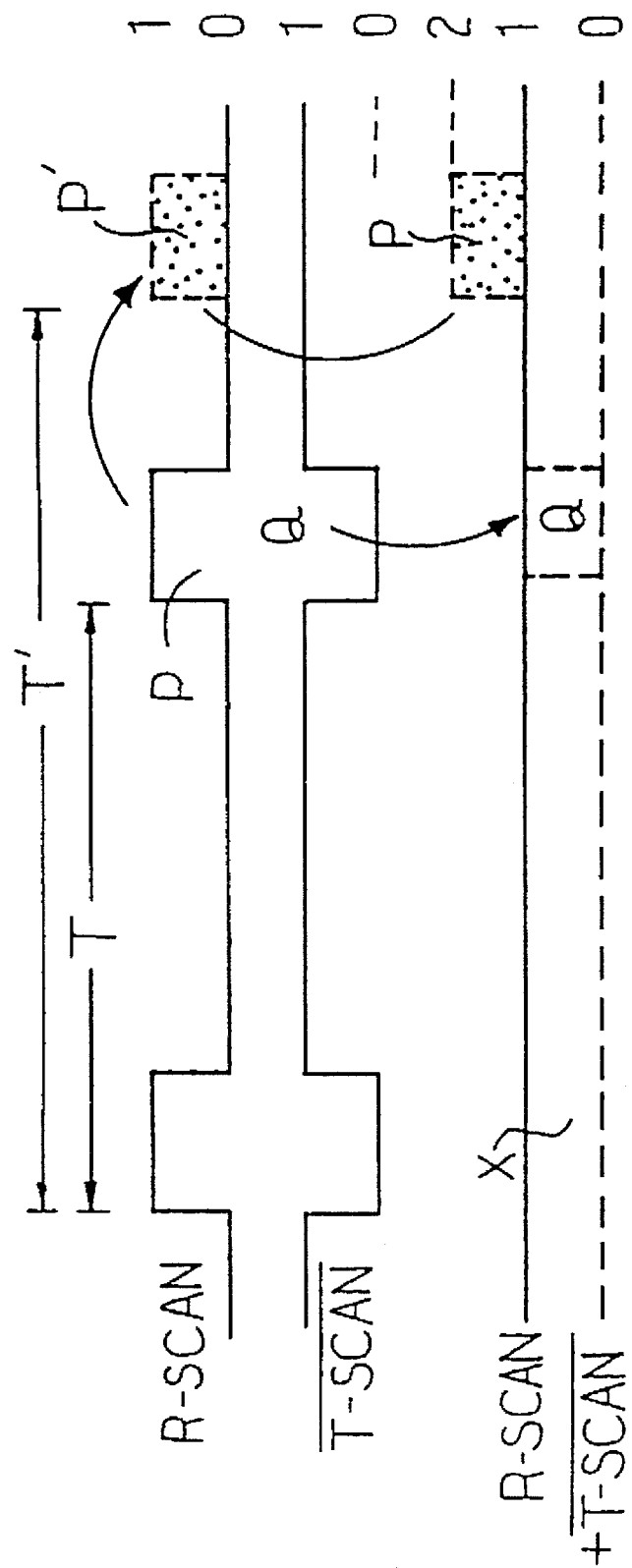
FIG. 11 is a time chart for illustrating an operation of the coincidence detecting circuit

Operation of this circuit, as shown by the time chart in FIG. 11, is such that when the periods of two signals are coincident, the addition signal X (inversion T-SCAN+R-SCAN) always has a level of logic value "1". When however, generation of the output signal R-SCAN of the light reception side shift register 8 changes from position P to position P', so that the generation period T is extended to T' (T'>T), then the logic value "0" of the inversion output signal T-SCAN of the light transmission side, appears in the addition signal X (indicated by Q), after T seconds (at position P), and the logic value "1" of the light reception side output signal R-SCAN generated at position P', appears in the addition signal X as a level of logic value "2", after T' seconds. Since the logic value "0" level is less than the lower limit threshold value of the fail-safe window comparator WC2, and the logic value "2" level is greater than the upper limit threshold value, the output signal becomes a logic value "0" (indicating that the signals do not coincide).

The fault mode of the coincidence detecting circuit 10 is similar to that shown in FIG. 4, in that, at the time of a circuit fault, the output of the addition signal X is stopped or becomes power source potential Vcc (in either case corresponding to logic value "0"), thus going outside of the threshold value range of the window comparator WC2, so that the output becomes a logic value "0".

With the present invention as described above, since checking of the scanning output signal which is generated using the shift register is carried only on the light transmission side, and also the coincidence or non coincidence of the output of the last stage of the shift register is monitored, the construction of the sensor system can be simplified. Moreover, the addition operation to determine normal/abnormal operation of the generating conditions of the scanning output signal is simple and the capacitors can be ones with a small voltage endurance.

INDUSTRIAL APPLICABILITY

With systems operating in a work space common to both a machine and an operator, the present invention can significantly improve the safety of an operator working in the common work space, and prevent injury of the operator by the machine, and thus has considerable industrial applicability.

We claim:

1. A control circuit for a fail-safe multi-axis light beam type sensor comprising:

a scanning signal generating circuit for generating a scanning signal which includes a constant interval clock signal;

a light transmission side scanning circuit having a light transmission side shift register for generating sequential scanning output signals for each input of the clock signal included in said scanning signal, for sequentially switching and scan driving a plurality of light emitting elements, with the scanning output signals of said light transmission side shift register so that sequential AC light beams are emitted from said plurality of light emitting elements;

a light reception side scanning circuit having a light reception side shift register for generating sequential scanning output signals for each input of a clock signal which is the same as said constant interval clock signal, for generating a scanning output signal for sequentially switching and scan driving a number of light receiving elements of the same number as said plurality of light emitting elements and positioned opposite thereto, with the scanning output signals of said light reception side shift register, and for generating an AC light received output signal when said plurality of light receiving elements receive said AC light beams;

a fail-safe amplifying/level checking circuit for amplifying, then level checking and rectifying said AC light received output signal, and generating an output of logic value "1", with the output thereof becoming a logic value of zero when a fault occurs;

a fail-safe scanning output signal checking circuit for adding output levels of the scanning output signals of said light transmission side scanning circuit, and judging a generating condition of the scanning output levels as a normal condition when the logic level of the added value is "1" and then generating an output of logic value "1" and judging the generating condition of the scanning output signals as an abnormal condition when the logic level of said added value is "2" or more or zero, and generating an output of logic value "0" with the output thereof becoming a logic value of zero when a fault occurs;

a fail-safe coincidence detecting circuit for performing an addition operation for every one scanning period on the final scanning output signal of said light transmission side scanning circuit and the final scanning output signal of said light reception side scanning circuit, and when the logic level of the added value is "1", judging that said final scanning output signals are synchronized with each other and generating an output of logic value "1", and when the logic level of the added value is "2" or "0", judging that said final scanning output signals are not synchronized with each other and generating an output of logic value "0", with the output thereof becoming a logic value of zero when a fault occurs;

a fail-safe AND circuit for performing a logical product operation on the respective outputs of said amplifying/ level checking circuit, said scanning output signal checking circuit, and said coincidence detecting circuit, and when all the outputs are of a logic value "1", generating an output of logic value "1", with the output thereof becoming a logic value of zero when a fault occurs; and a fail-safe sample/hold circuit for holding the output of logic value "0" from said AND circuit for at least one scanning period, with the output thereof becoming a logic value of zero when a fault occurs.

2. A control circuit for a fail-safe multi-axis light beam type sensor according to claim 1, wherein said light transmission side scanning circuit comprises;

a light emitting circuit including the plurality of light emitting elements;

said light transmission side shift register including a plurality of D-K flip-flops corresponding in number to the number of light emitting elements of the light emitting circuit;

a monostable multivibrator for extending pulse width of the scanning signals input from said scanning signal generating circuit for a predetermined time, and outputting the extended signals to a data input terminal of a first stage D-K flip-flop of said light transmission side shift register;

a plurality of first NOT circuits having input sides connected to non inversion output terminals of the D-K flip-flops, and output sides thereof connected to cathode sides of the respective light emitting elements of said light emitting circuit;

a carrier signal generating circuit for generating a carrier signal of a predetermined frequency, connected to anode sides of the respective light emitting elements of said light emitting circuit through respective resistors;

a plurality of second NOT circuits with input sides thereof connected between said respective light emitting elements of the light emitting circuit and said resistors, and output sides thereof connected to data input terminals of respective next stage D-K flip-flops, and wherein the clock signal included in the scanning signal from the scanning signal generating circuit is input to the clock input terminals of said respective D-K flipflops, and the scanning output signals input to said scanning output signal checking circuit are taken off from the output sides of said second NOT circuits.

3. A control circuit for a fail-safe multi-axis light beam type sensor according to claim 1, wherein said light reception side scanning circuit comprises:

a light receiving circuit including the plurality of light receiving elements positioned opposite to the plurality of light emitting elements with a danger region therebetween, and a plurality of AC amplifying circuits provided for the respective light receiving elements, said light reception side shift register including a plurality of D-K flip-flops corresponding in number to the number of light receiving elements of said light receiving circuit and amplifying AC signals which are generated when the respective light receiving elements receive light beams from the light emitting elements, a monostable multivibrator for extending pulse width of the scanning signal input from said scanning signal generating circuit for a predetermined time, and outputting the extended signals to a data input terminal of a first stage D-K flip-flop of said light reception side shift register, a plurality of third NOT circuits with input sides thereof connected to inversion output terminals of the respective D-K flip-flops, and wherein the same clock signal as for the light transmission side scanning circuit is input to the clock input terminals of said respective D-K flip-flops, and the output sides of said third NOT circuits are connected to respective output lines from said AC amplifying circuits and then connected via the respective output lines from said AC amplifying circuits to respective data input terminals of the next stage D-K flip-flops.

4. A control circuit for a fail-safe multi-axis light beam type sensor according to claim 1, wherein said scanning output signal checking circuit incorporates, an adding circuit comprising a plurality of coupling capacitors connected respectively in series to a plurality of input terminals corresponding in number to a plurality of scanning output signals sequentially input from the shift register of the light transmission side scanning circuit, a plurality of first diodes for clamping the output sides of the respective coupling capacitors at power source potential, and a plurality of second diodes for rectifying/transmitting the outputs of the coupling capacitors clamped at power source potential by the respective first diodes, to a single output terminal, and a fail-safe first window comparator which performs a threshold operation on the output level of said adding circuit, and generates an output of logic value "1" when the output level is inside the threshold value range, and generates an output of logic value "0" when the output level is outside the threshold value range, with the output thereof becoming a logic value of zero when a fault occurs.

5. A control circuit for a fail-safe multi-axis light beam type sensor according to claim 1, wherein said coincidence detection circuit incorporates;

an adding circuit comprising two coupling capacitors connected respectively in series to respective input terminals, to which the final scanning signal output for one scanning period from said light transmission side scanning circuit and the final scanning signal output for one scanning period from said light reception side scanning circuit, are input with a complementary relation to each other, two third diodes for clamping the output sides of the respective coupling capacitors at power source potential, and two fourth diodes for rectifying/transmitting the outputs of the respective coupling capacitors clamped at power source potential by the respective third diodes, to a single output terminal, and a fail-safe second window comparator which performs a threshold operation on the output level of said adding circuit, and generates an output of logic value "1" when the output level is inside the threshold value range, and generates an output of logic value "0" when the output level is outside the threshold value range, with the output thereof becoming a logic value of when a fault occurs.

6. A control circuit for a fail-safe multi-axis light beam type sensor according to claim 1, wherein said sample/hold circuit comprises a fail-safe on-delay circuit which gives an output of logic value "0" at the time of a fault.

* * * * *